United States Patent
Muzslay

[19]

[11] Patent Number: 6,139,345
[45] Date of Patent: Oct. 31, 2000

[54] CLIP FOR COUPLING COMPONENT TO CONNECTOR CONTACTS

[75] Inventor: Steven Zolten Muzslay, Huntington Beach, Calif.

[73] Assignee: ITT Manufacturing Enterprises, Inc., Wilmington, Del.

[21] Appl. No.: 09/419,536

[22] Filed: Oct. 18, 1999

[51] Int. Cl.[7] .................................................. H01R 13/02
[52] U.S. Cl. .................. 439/225; 439/189; 439/510; 439/620
[58] Field of Search ..................... 439/225, 510, 439/189, 620

[56] References Cited

U.S. PATENT DOCUMENTS

| | | |
|---|---|---|
| 3,111,641 | 11/1963 | Wilentchik . |
| 3,825,874 | 7/1974 | Peverill . |
| 4,056,299 | 11/1977 | Paige .......................................... 339/95 |
| 4,064,426 | 12/1977 | Tyler ........................................ 362/226 |
| 4,362,350 | 12/1982 | von Harz . |
| 4,371,226 | 2/1983 | Brancaleone . |
| 4,729,752 | 3/1988 | Dawson et al. . |
| 4,749,368 | 6/1988 | Mousissie ................. 439/421 |
| 4,804,332 | 2/1989 | Pirc . |
| 5,181,859 | 1/1993 | Foreman et al. . |
| 5,290,191 | 3/1994 | Foreman et al. . |
| 5,554,050 | 9/1996 | Marpoe, Jr. . |
| 5,580,279 | 12/1996 | Belopolsky et al. . |
| 5,599,208 | 2/1997 | Ward . |
| 5,626,494 | 5/1997 | Belopolsky et al. . |
| 5,639,264 | 6/1997 | Belopolsky et al. . |
| 5,650,759 | 7/1997 | Hittman et al. . |
| 5,769,667 | 6/1998 | Belopolsky . |
| 5,803,769 | 9/1998 | Belopolsky . |
| 5,816,857 | 10/1998 | Belopolsky . |
| 5,823,827 | 10/1998 | Belopolsky . |
| 5,830,016 | 11/1998 | Chuang . |
| 5,842,888 | 12/1998 | Belopolsky . |

FOREIGN PATENT DOCUMENTS

| | | |
|---|---|---|
| 0 600 418 A1 | 11/1993 | European Pat. Off. . |
| 2146 847 | 9/1971 | Germany . |
| 3338929 C2 | 10/1983 | Germany . |
| 0056878 | 8/1988 | Japan . |

Primary Examiner—Paula Bradley
Assistant Examiner—Truc Nguyen
Attorney, Agent, or Firm—Thomas L. Peterson

[57] ABSTRACT

A component unit (40) is provided for connecting a circuit component (42) such as a chip resistor to a pair of contacts (22A, 22B) of a connector, in a simple, robust, and low-cost manner. The component unit includes a chip component in the form of a block with opposite end portions forming terminals, and a pair of clips (44, 46) that each has a chip-engaging part (52) soldered to a component terminal and a pin-engaging part (50) that can be slid over a pin portion of a connector contact. The chip-engaging part of each clip includes three walls (80, 82, 84) forming a channel that closely receives an end portion of the chip and that is soldered thereto. A connector insulator (26) has a surface (118) with a recess (120) that closely receives the chip component and the side walls (82, 84) of each clip channel.

12 Claims, 4 Drawing Sheets

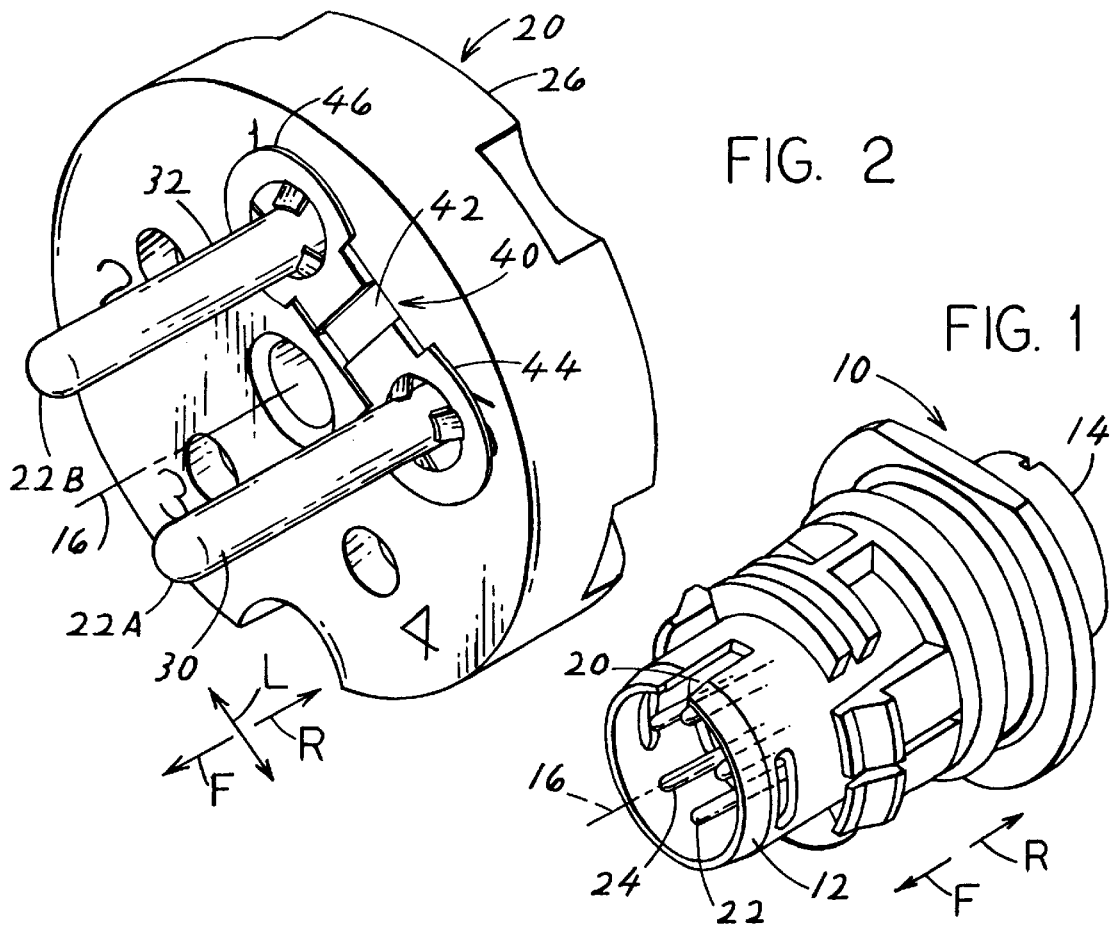
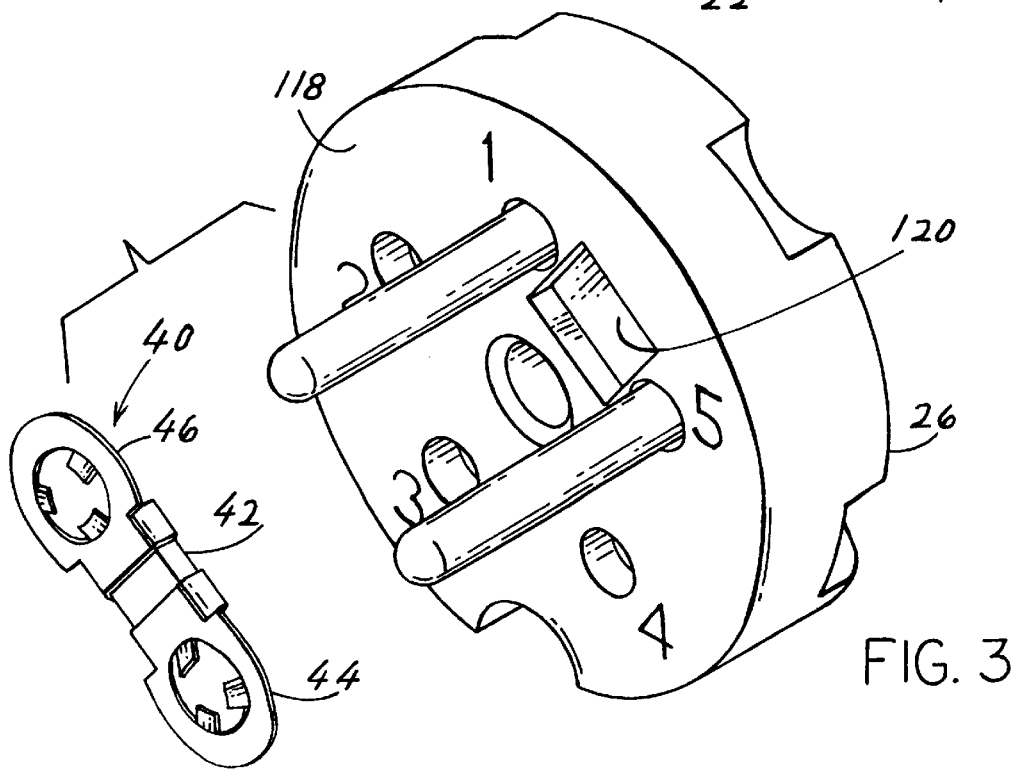
FIG. 1
FIG. 2
FIG. 3

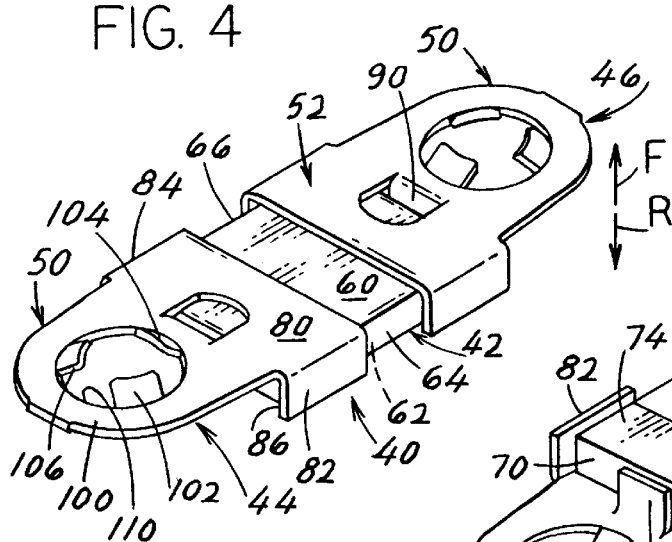
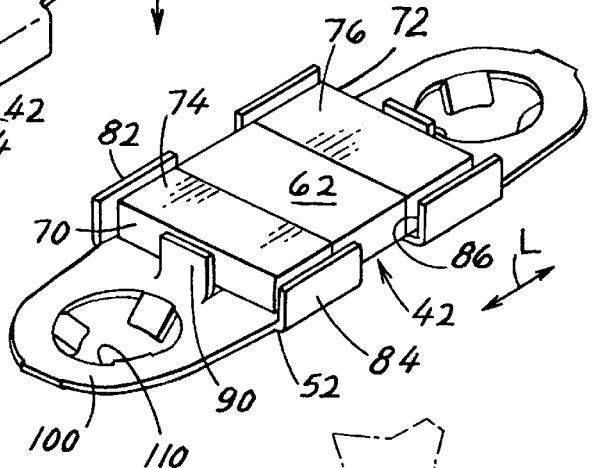
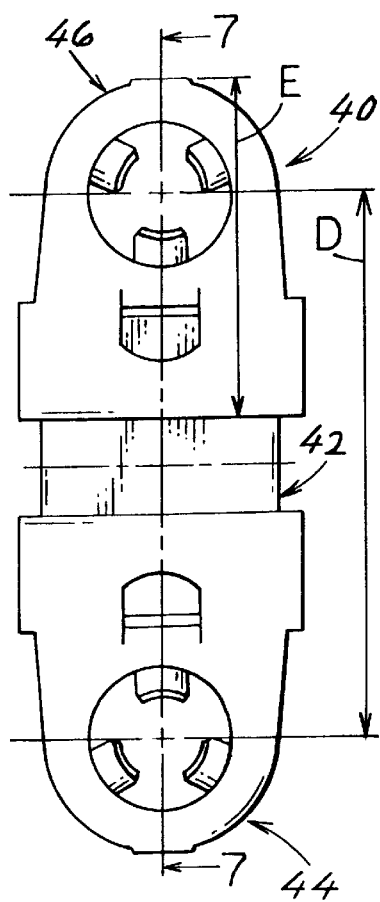
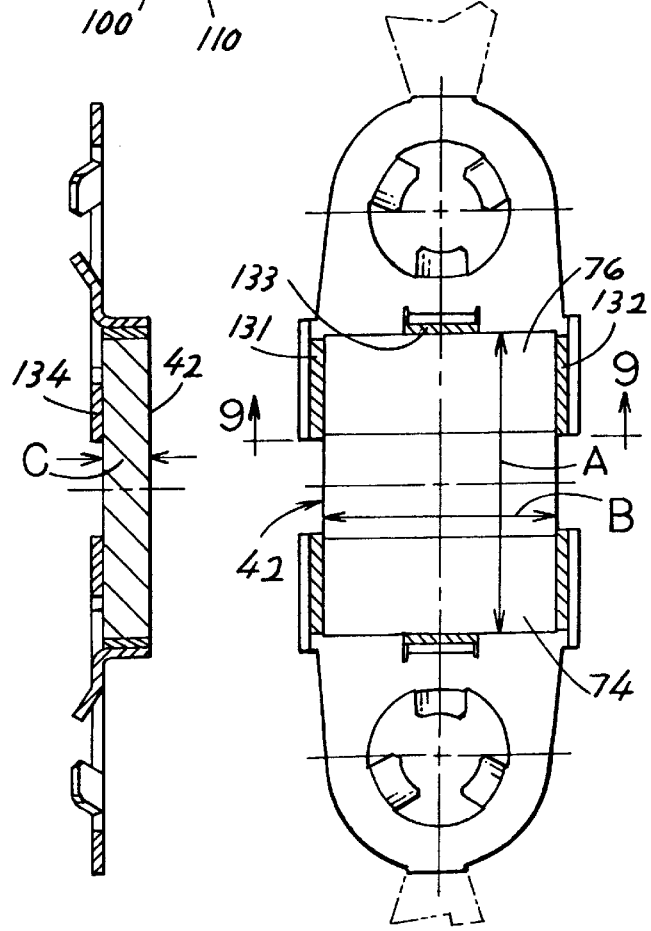
FIG. 4 FIG. 5 FIG. 6 FIG. 7 FIG. 8

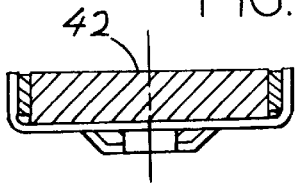
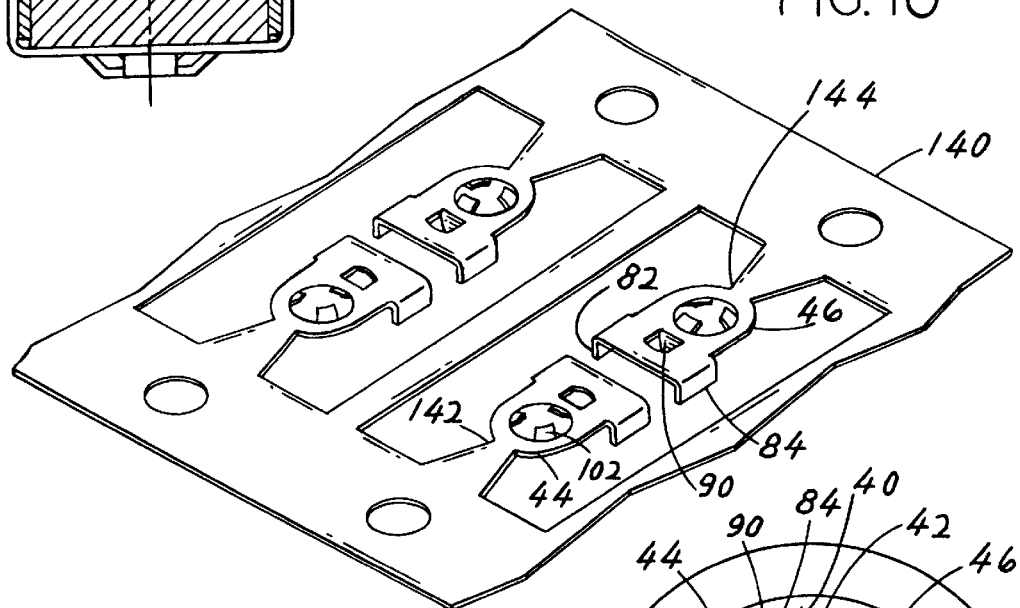
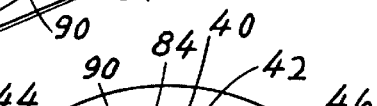
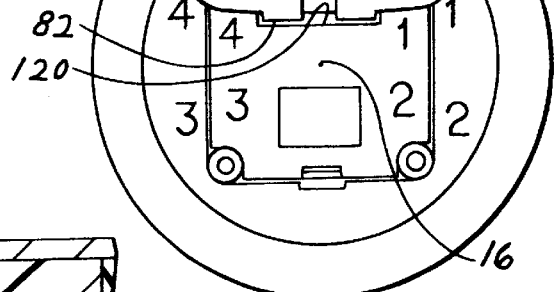
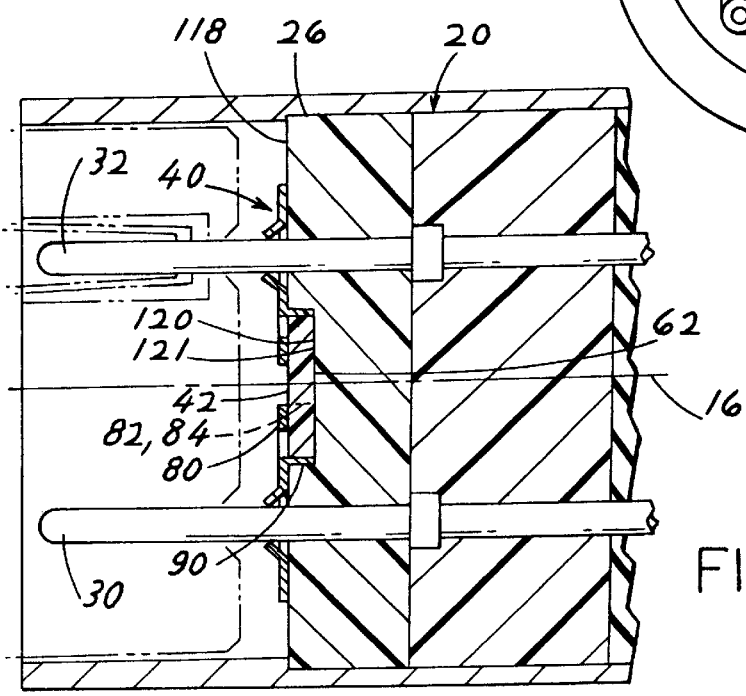

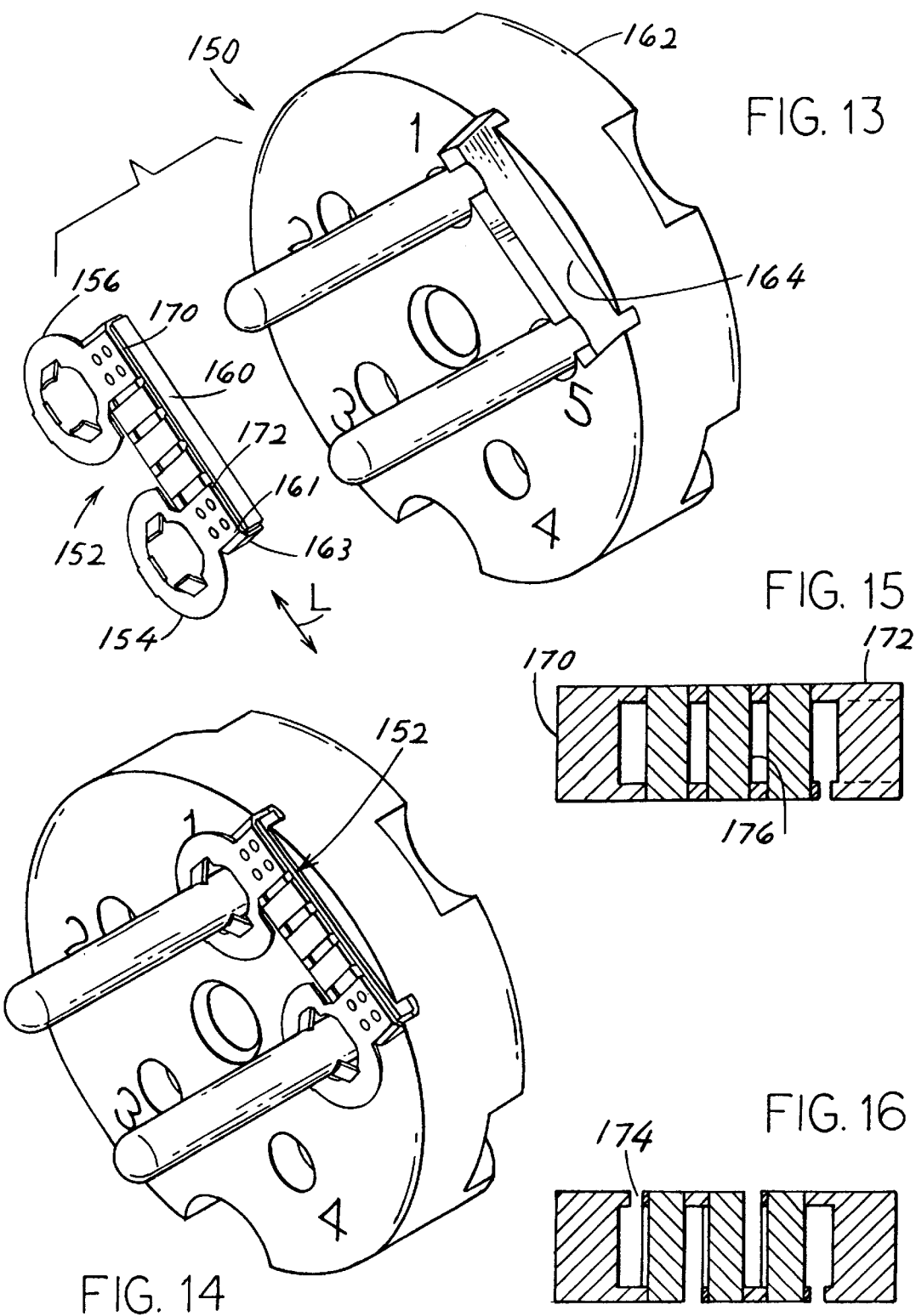

CLIP FOR COUPLING COMPONENT TO CONNECTOR CONTACTS

BACKGROUND OF THE INVENTION

There are applications where it is desirable to connect a circuit component such as a resistor, capacitor, etc., between contacts of a connector, to avoid the need for a separate circuit board for mounting the component and making connections. One application is in connectors for carrying currents that operate fuel injector solenoids in internal combustion engines, where a moderate resistance is desirable between two contacts of a connector that connects a control circuit to a solenoid. Variation in resistance can adjust solenoid operation for maximum fuel efficiency and minimum air pollution. While wire-tailed resistors are often used, a chip resistor, which includes a rigid block with terminals at opposite ends, is more rugged and therefore desirable where higher reliability is required. Apparatus of low-cost but high ruggedness and reliability for connecting each terminal of the chip component such as a chip resistor, to a corresponding contact of the connector, would be desirable.

SUMMARY OF THE INVENTION

In accordance with one embodiment of the present invention, a chip unit for connecting a chip component to contacts of a connector, and a connector with a chip unit coupled to connector contacts, is provided where the chip unit is rugged and of low cost. The chip unit includes a pair of clips that each has a pin-engaging part for engaging a pin portion of a connector contact, and a chip-engaging part for mechanically holding and electrically connecting to the chip component. The chip-engaging part of each clip preferably has walls forming a channel with three sides that closely receive and are soldered to an end portion of the chip at a chip terminal.

The connector that receives the component unit has a recess forming a pocket that closely receives the chip component and channels of the pair of clips. The side walls of the channel project rearwardly into the pocket, while tines on the pin-engaging part of each clip extend forwardly of a surface of the insulator.

The novel features of the invention are set forth with particularity in the appended claims. The invention will be best understood from the following description when read in conjunction with the accompanying drawings.

BRIEF DESCRIPTION OF THE DRAWINGS

FIG. 1 is a front isometric view of a connector in which a component unit can be installed.

FIG. 2 is a front isometric view of a portion of an insulator of the connector of FIG. 1, with a component unit fully installed thereon.

FIG. 3 is an exploded view of the insulator and component unit of FIG. 2.

FIG. 4 is a front isometric view of the component unit of FIG. 3.

FIG. 5 is a rear isometric view of the component unit of FIG. 4.

FIG. 6 is a front elevation view of the component unit of FIG. 4.

FIG. 7 is a view taken on line 7—7 of FIG. 6.

FIG. 8 is a right side view of the component unit of FIG. 7.

FIG. 9 is a view taken on line 9—9 of FIG. 8.

FIG. 10 is an isometric view of a sheet of sheet metal that holds pairs of clips for constructing component units.

FIG. 11 is a simplified sectional view of the connector of FIG. 1, with the component unit of FIG. 2 installed thereon, and also showing, in phantom lines, a mating connector.

FIG. 12 is a front elevation view of the component unit of FIG. 6, shown mounted on a portion of a connector that has four contacts.

FIG. 13 is an exploded isometric view of an insulator and component unit of another embodiment of the invention.

FIG. 14 is a view of the insulator and component unit of FIG. 13 in an assembled position.

FIG. 15 is a plan view of the resistor chip component of the component unit of FIG. 14, prior to alterations to change its resistance.

FIG. 16 is a view similar to that of FIG. 15, but showing changes to change the resistance of the chip resistor.

DESCRIPTION OF THE PREFERRED EMBODIMENTS

FIG. 1 illustrates a connector 10 that has front and rear ends 12, 14 and an axis 16 extending in front and rear directions F, R. The connector includes an insulator 20 and a plurality of contacts 22 mounted in the insulator and having axially-elongated pin portions 24 projecting forward of the insulator for mating to socket contacts of a mating connector. FIG. 2 illustrates a portion 26 of the insulator and pin portions 30, 32 of two contacts 22A, 22B of the connector. The pin portions are spaced apart in a lateral direction L. A component unit 40 is shown, which includes a resistor chip component or resistor chip 42 and a pair of clips 44, 46 that are mechanically and electrically connected to the resistor chip 42 and to the contact pin portions 30, 32. The component unit 40 introduces a predetermined resistance of between about 1 and 25 kilo ohms between the two contacts.

FIGS. 4 and 5 show details of the component unit 40. Each of the clips 44, 46 is formed of sheet metal and has a pin-engaging part 50 for engaging the pin portion of the contact, and a chip-engaging part 52 for engaging the chip 42 such as the resistance chip component. The chip component 42 is in the form of a rigid block, that is, largely in the shape of a parallepiped or box. The chip has opposite block faces 60, 62, opposite block sides 64, 66 and opposite block ends 70, 72. The block has opposite end portions that form terminals 74, 76. For a resistor, resistance is measured between the terminal 74, 76.

The chip-engaging part 52 of each clip includes a base wall 80 and a pair of opposite clip side walls 82, 84. The side walls 82, 84 extend generally perpendicular to the base wall 80. The three walls 80, 82, 84 form a channel 86 that surrounds one of the terminals such as 74, on three sides. The three clip walls 80, 82, 84 are soldered to the corresponding chip terminal 74.

The component-engaging part 52 of the clip also has an end wall 90 that extends generally perpendicular to the base wall 80. The end wall abuts an end such as 70 of the chip component.

The pin-engaging part 50 of each clip includes a base portion 100 and three tines 102, 104, 106 that are bent forwardly out of the plane of the base portion 100. The pin-engaging part 50 of each clip is installed on a pin portion of a contact by inserting the pin portion through a hole 110 into which the tines project, and sliding the tines along the pin portion to the final position.

It can be seen that the base wall 80 of the chip-engaging part and the base portion 100 of the pin-engaging part of each clip lie substantially co-planar. The side walls or tabs 82, 84, 90 project rearwardly R from the base wall, while the tines 102, 104, 106 project forwardly F from the base portion 100.

FIG. 11 shows a component unit 40 installed on contact pin portions 30, 32. The insulator 26 has a front surface 118 with recess 120 that closely receives the chip component 42 and the clip walls or tabs 82, 84, 90 that project from the base wall 80. The rear end 62 of the chip lies substantially against the bottom wall 121 of the recess, so the bottom wall can help support the chip if large sudden forces are applied to the connector. FIG. 12 is a view taken along the axis 16, for a four-pin connector, showing that the chip component 42 and the projecting walls 82, 84, 90 of the clips occupy a majority of the area of the recess 120, and preferably at least 80% of the area as viewed along the axis 16. This minimizes the area occupied by the recess, and also enables the walls of the recess to limit movement of the chip component 42 and of the clips. That is, when the component unit 40 is subject to forces perpendicular to the axis 16, the walls of the recess 120 limit movement of the component unit to prevent damage. The tines of the clips permit slight shifting of the clips while the walls of the recess 120 prevent more than a small movement. Although applicant prefers to mount the clips on the mating end of the connector, they could be mounted on other pin portions of connectors.

FIGS. 6–8 show that the terminals 74, 76 of the chip component 42 are joined to the clips by solder at the four locations 131–134 for each clip. Applicant uses the term "solder" to include conductive paste, solder, brazing, or other mechanical joining method that produces low resistance electrical connections and good mechanical connections.

FIG. 10 shows how pairs of clips 44, 46 are cut from a larger sheet 140 of sheet metal such as a beryllium copper, with the clips still joined at 142, 144 to the sheet. After the tabs 82, 84, 90 and tines such as 102 have been bent, the clips are ready for placement against and soldering to the chip component. Applicant does not sever the clips from the carrier sheet 140, but places each chip components between the tabs of the pair of clips and solders the terminals to the tabs. Only then are the clips separated from the carrier sheet 140 by cuts at 142, 144. This method of manufacture avoids the need to handle so many tiny objects.

For a component unit 40 of the construction illustrated in FIGS. 1–11, that applicant has constructed, the chip component 42 was a resistor having a lateral length A of 3.2 mm, a width B of 2.4 mm and thickness C of 0.61 mm. The distance D between a pair of pins of the connector was 5.84 mm. Each clip had a length E of 3.63 mm and other dimensions as illustrated, with the sheet metal of the clips being a beryllium copper alloy of a thickness of 0.1 mm.

FIGS. 13–16 illustrate a portion of another connector 150 with a component unit 152 of different construction. The component unit includes a pair of clips 154, 156 soldered to terminals at laterally L opposite ends of a chip component 160 which is a resistor. Each clip has two perpendicular walls 161, 163 that lie facewise against the chip terminal. An insulator part 162 has a recess 164 for receiving the chip component. The particular chip component 160, which is rigid and of block shape, is designed to enable adjustment of resistance between its opposite terminals 170, 172. FIG. 15 shows the chip resistor as initially constructed, with a low resistance between its opposite terminals 170, 172. FIG. 16 shows cuts such at 174 for increasing the resistance, with cuts at different locations providing different resistances. In addition, each portion such as 176 of the resistor can be trimmed in width by a laser beam. This allows a choice of nine different resistances. Applicant initially designed the unit 152 to enable choice of resistance. Such different resistances were necessary to compensate for the fact that different solenoids require different resistances for optimum operation. After designing the component unit 152 of FIGS. 13–16, applicant decided to construct the component unit 40 of FIGS. 1–11, but to provide resistance components 42 of nine different resistances. A component unit with a selected resistance would be used for each particular connector.

Although the term "chip component" is used to indicate a component of largely box shape, it should be understood that chips of different shapes can be used. A chip component is generally of substantially rigid construction.

Thus, the invention provides a component unit with a pair of sheet metal clips that are joined to terminals of a chip component and that have parts for engaging pin portions of a contact, and a connector that includes such component unit. Each sheet metal clip of a component unit includes a chip-engaging portion that can be soldered to a terminal of a chip component and a pin-engaging portion that can engage a pin portion of a connector contact. The pin-engaging portion preferably includes a hole with tines that can be slid along a contact pin portion to mechanically grip and electrically connect to the pin portion of the contact. The chip-engaging portion of the clip preferably includes walls forming a channel with a base wall that lies on a surface of the chip component and with rearwardly projecting walls that lie on opposite sides of the chip component. An insulator with passages through which the contacts pass, has a recess that closely receives the chip component and projecting walls of the clips.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A connector that has an axis and that includes an insulator with a plurality of laterally-spaced passages extending parallel to said axis, said connector also including a plurality of contacts lying in said passages including first and second contacts, with each contact having an axially-elongated pin portion, comprising:

a chip circuit component in the form of a block with laterally spaced terminals;

a pair of clips that are each formed of sheet metal and that each has a pin-engaging part and a chip-engaging part, with each of said pin-engaging parts including a plurality of tines lying around and axially slideable to a final position on a pin portion of one of said first and second contacts, and with each of said chip engaging parts having a wall part that is connected to one of said terminals, with the distance between the pin-engaging parts of said pair of clips equal to the distance between said pin portions of said first and second contacts.

2. The connector described in claim 1 wherein:

said block of said component has a box shape with four chip sides, and two laterally spaced ends, with each terminal having terminal sides extending along said chip sides;

said chip-engaging part of each clip has at least two perpendicular walls, including said wall part, with each wall lying against one of said terminal sides of one of said terminals.

3. The connector described in claim 1 wherein:

said block of said component has a box shape with four chip sides, and two laterally spaced ends, with each terminal having terminal sides extending along said chip sides;

said chip-engaging part of each clip has three walls, including said wall part, lying at three sides of a rectangle, including a main wall and opposite side walls, with each wall lying against one of said terminal sides of one of said terminals, and each chip-engaging part of each clip has an end wall that lies against one of said ends of said block.

4. The connector described in claim 1 wherein:

said insulator has a front face and said pin portions of said contacts project forward of said front face to mate with contacts of a mating connector;

said insulator front face has a recess that receives said chip circuit component.

5. The connector described in claim 4 wherein:

said recess has a bottom wall, and said chip circuit component has a rear wall that lies substantially against said recess bottom wall.

6. A connector that has an axis and that includes an insulator with a plurality of laterally-spaced passages each extending parallel to said axis, said connector also including a plurality of contacts lying in said passages including laterally-spaced first and second contacts, with each contact having an axially-elongated pin portion, comprising:

a chip circuit component in the form a block with laterally spaced block ends that each forms a terminal;

a pair of clips that are each formed of sheet metal and that each has a pin-engaging part and a chip-engaging part, with each of said pin-engaging parts lying around and engaging a pin portion of one of said first and second contacts, and with each of said chip engaging parts including three perpendicular walls forming a channel that closely receives one of said block ends and that is soldered to one of said terminals lying at the block end.

7. The connector described in claim 6 wherein:

said channel includes largely parallel opposite side walls and a main wall that connects said side walls;

said insulator has a recess that closely receives said chip circuit component and said opposite side walls so said chip circuit component and said side walls occupy a majority of the area of said recess as viewed along said axis.

8. The connector described in claim 6 wherein:

said block of said circuit component has laterally opposite ends, and the chip-engaging part of each of said clips includes an end tab that abuts one of said ends of said block.

9. The connector described in claim 6 wherein:

said connector has a front mating end, said insulator has a front face, and said contact pin portions project forward of said insulator front end and form contact mating ends;

said insulator has an insulator recess in its front face between said first and second contacts, said pin-engaging ends of said clips each includes a base portion that lies around one of said contact mating ends and substantially against said insulator front face, and a plurality of tines projecting forward of said base portion;

said perpendicular walls of each chip-engaging part includes a channel base wall that is substantially coplanar with said base portion of said pin-engaging end and a pair of channel side walls that extend substantially perpendicular to said channel base wall and that lie on opposite sides of one of said terminals and project rearwardly into said insulator recess.

10. A component unit for mounting on contact pin portions of a pair of contacts of a connector, comprising:

a chip component that is generally in the shape of a block with opposite block faces, opposite block sides, and opposite block ends, and with opposite end portions and a terminal at each of said end portions;

a pair of clips that each have a pin-engaging part for engaging one of said contact pin portions and a chip-engaging part, with the chip-engaging part having walls forming a channel, including a base wall that lies against one of said block faces and a pair of side walls projecting generally perpendicular to said base wall and lying against said opposite block sides, with the channel of each clip being soldered to one of said terminals.

11. The component unit described in claim 10 wherein:

the pin-engaging part of each clip has a base portion and a plurality of tines projecting therefrom;

each of said clips has a planar portion lying in a plane and having front and rear faces, with said planar portion including said base wall of said chip-engaging part and said base portion of said pin engaging part, with said tines projecting forwardly of said front face and said side walls projecting rearwardly of said rear face.

12. A method for creating component units that each includes a chip circuit component with laterally-spaced terminals and a pair of laterally-spaced clips lying at predetermined positions relative to each other and to said component, with each clip of a unit having a contact-engaging part for engaging a contact of a connector and having a chip-engaging part that engages the chip component of the unit at one of said terminals of the chip component, comprising:

cutting and bending a sheet of sheet metal, including forming said clips in pairs with the clips of each pair lying at said predetermined positions relative to each other while being fixed in position with respect to each other by being still attached to said sheet of sheet metal;

laying one of said chip components against a pair of clips that are fixed to each other at said predetermined positions, and soldering said terminals to said chip-engaging parts of said pair of clips;

after said step of soldering, severing each of said clips from said sheet of sheet metal.

* * * * *